(12) United States Patent
Ting et al.

(10) Patent No.: US 8,963,534 B2
(45) Date of Patent: Feb. 24, 2015

(54) TRIAXIAL PIEZOELECTRIC SENSOR

(71) Applicant: Chung-Yuan Christian University, Chung Li, Tao Yuan County (TW)

(72) Inventors: Yung Ting, Chung Li (TW); Sheuan-Perng Lin, Chung Li (TW); Hariyanto Gunawan, Chung Li (TW)

(73) Assignee: Chung-Yuan Christian University, Chung Li, Tao Yuan County (TW)

( * ) Notice: Subject to any disclaimer, the term of this patent is extended or adjusted under 35 U.S.C. 154(b) by 175 days.

(21) Appl. No.: 13/856,831

(22) Filed: Apr. 4, 2013

(65) Prior Publication Data

US 2014/0002058 A1    Jan. 2, 2014

(30) Foreign Application Priority Data

Jun. 27, 2012  (TW) .............................. 101123055 A
Jul. 5, 2012    (TW) .............................. 101213021 U

(51) Int. Cl.
| | |
|---|---|
| *G01R 29/22* | (2006.01) |
| *G01R 5/28* | (2006.01) |
| *B06B 1/06* | (2006.01) |
| *G01L 1/16* | (2006.01) |
| *G01L 5/16* | (2006.01) |
| *H01L 41/22* | (2013.01) |

(52) U.S. Cl.
CPC ................ *G01R 5/28* (2013.01); *B06B 1/0692* (2013.01); *B06B 1/0644* (2013.01); *B06B 1/0622* (2013.01); *G01L 1/16* (2013.01); *G01L 5/167* (2013.01); *H01L 41/22* (2013.01)
USPC ........................................... 324/109; 324/78

(58) Field of Classification Search
CPC .. B06B 1/0692; B06B 1/0622; B06B 1/0644; G01R 5/28; H01L 41/22
USPC ................ 324/72, 76.11–76.83, 78, 83, 109; 310/309, 311, 313, 358, 363–365, 328, 310/338
See application file for complete search history.

(56) References Cited

U.S. PATENT DOCUMENTS

| | | | |
|---|---|---|---|
| 6,492,762 B1 * | 12/2002 | Pant et al. ...................... | 310/334 |
| 8,314,536 B2 * | 11/2012 | Ito et al. ......................... | 310/365 |
| 2012/0032559 A1 * | 2/2012 | Hino et al. ..................... | 310/331 |

* cited by examiner

*Primary Examiner* — Jermele M Hollington
*Assistant Examiner* — Raul Rios Russo
(74) *Attorney, Agent, or Firm* — Muncy, Geissler, Olds & Lowe, P.C.

(57) ABSTRACT

A triaxial piezoelectric sensor includes a PVDF layer, a first line layer, and a second line layer. The PVDF layer has multiple first electrodes and multiple second electrodes. Each first electrodes corresponds to each second electrodes for forming directions of polarization along the X-Y-Z axes. The first line layer has multiple first electrical connection portions and multiple first signal lines. Each first electrical connection portions corresponds to each first electrodes. The second line layer has multiple second electrical connection portions and multiple second signal lines. Each second electrical connection portions corresponds to each second electrodes. The PVDF layer is sandwiched between the first line layer and the second line layer. When an external force is applied to the PVDF layer, the first signal lines and the second signal lines transmit electrical signals according to the deformation of the PVDF layer.

10 Claims, 18 Drawing Sheets

TRIAXIAL PIEZOELECTRIC SENSOR

FIELD OF THE INVENTION

The present invention relates to a piezoelectric sensor, and more particularly relates to a triaxial piezoelectric sensor.

BACKGROUND

The piezoelectric effect the use of material deformation to convert mechanical energy to electrical energy or to convert electric energy to mechanical energy. Since the piezoelectric feature of $BaTiO_3$ was discovered in 1942, studies on various piezoelectric materials have continued.

Conventional piezoelectric materials are based on the inorganic ceramic $BaTiO_3$ and lead ziroconate-titanate. In general, piezoelectric ceramic materials have the features of small size, fast reaction, and low power consumption, but limitations on their use include fragility and structural damage due to uneven force applied thereon.

However, inorganic piezoelectric materials are hard, fragile, and heavy, and they are difficult to process into thin films or films with complicated shapes. The cost of such materials is also high.

SUMMARY OF INVENTION

A major objective of the present invention is to provide a triaxial piezoelectric sensor with high sensitivity.

Another objective of the present invention is to provide a thin triaxial piezoelectric sensor.

To achieve the aforementioned objectives, the present invention provides a triaxial piezoelectric sensor, including a polyvinylidene (PVDF) layer, a first line layer, and a second line layer. The PVDF layer has a plurality of first electrodes located in its upper surface and a plurality of second electrodes located in its bottom surface. Each of the first electrodes and each of the second electrodes correspond to each other, forming directions of polarization along the X-Y-Z axes. The first line layer has a plurality of first electrical connection portions located in a bottom surface of the first line layer and has a plurality of first signal lines located in an upper surface of the first line layer. Each of the first electrical connection portions and each of the first electrodes correspond to each other. The second line layer has a plurality of second electrical connection portions located in an upper surface of the second line layer and has a plurality of second signal lines located in a bottom surface of the second line layer. Each of the second electrical connection portions and each of the second electrodes correspond to each other. The PVDF layer is sandwiched between the first line layer and the second line layer. When the PVDF layer is deformed due to an external force, the first signal lines and the second signal lines transmit electrical signals according to the deformation of the PVDF layer.

The first electrodes and the second electrodes are deposited in the PVDF layer using physical vapor deposition (PVD). Each of the first electrodes includes a circular portion and a plurality of arc segments. The arc segments surround the circular portions, forming an X-Y axial polarized direction. Each of the second electrodes includes a corresponding circular portion, which respectively corresponds to each of the circular portions, forming a Z axial polarized direction. In another embodiment, the first electrode includes a polygonal portion and a plurality of line segments. Each line segment is respectively located outside each edge of the polygonal portion, forming an X-Y axial polarized direction. Each of the second electrodes includes a corresponding polygonal portion respectively corresponding to each of the polygonal portions.

Preferably, the triaxial piezoelectric sensor further includes two insulation layers respectively located above the first line layer and below the second line layer. The triaxial piezoelectric sensor also includes two rubber layers respectively located above the two insulation layers. Each rubber layer includes a plurality of protrusion portions. When an external force is applied to the PVDF layer, the plurality of protrusion portions are able to amplify the external force to increase the sensitivity of the PVDF layer.

Another embodiment of the present invention is a triaxial piezoelectric sensor, including a first PVDF layer, a first line layer, a second line layer, a second PVDF layer, and a third line layer. The first PVDF layer has a plurality of first electrodes located in an upper surface and has a plurality of second electrodes located in a bottom surface. Each of the first electrodes and each of the second electrodes correspond to each other, forming a Z axial polarized direction. The second PVDF layer has a plurality of third electrodes located in an upper surface, forming an X-Y axial polarized direction. The first line layer has a plurality of first electrical connection portions located in a bottom surface of the first line layer and has a plurality of first signal lines located in an upper surface of the first line layer. Each of the first electrical connection portions and each of the first electrodes correspond to each other. The second line layer has a plurality of second electrical connection portions located in an upper surface of the second line layer and has a plurality of second signal lines located in a bottom surface of the second line layer. Each of the second electrical connection portions and each of the second electrodes correspond to each other. The third line layer has a plurality of third electrical connection portions located in a bottom surface of the third line layer and has a plurality of third signal lines located in an upper surface of the second line layer. Each of the third electrical connection portions and each of the third electrodes correspond to each other. The first PVDF layer is sandwiched between the first line layer and the second line layer, and the third line layer is located above the second PVDF layer. When the first PVDF layer and the second PVDF layer are deformed because of an external force, the plurality of first signal lines, the plurality of second signal lines, and the plurality of third signal lines respectively transmit electrical signals according to the deformation of the first PVDF layer and the second PVDF layer. In this embodiment, the first electrode, the second electrode, and the third electrode are deposited using PVD. The first electrodes and the second electrodes have a circular shape, a square shape, or a polygonal shape forming a Z axial polarized direction. The third electrodes include circular portions and a plurality of arc segments. The plurality of arc segments surround the circular portion, forming an X-Y axial polarized direction. Alternatively, the third electrodes include a square shape (or a polygonal shape) and four line segments (or multiple line segments), and the four line segments are outside the square shape forming an X-Y axial polarized direction.

Yet another embodiment according to the present invention is a triaxial piezoelectric sensor that includes a first PVDF layer, a second PVDF layer, a third PVDF layer, a first line layer, a second line layer, a third line layer, and a fifth line layer. The first PVDF layer has a plurality of first electrodes located in an upper surface and has a plurality of second electrodes located in a bottom surface. Each of the first electrodes and each of the second electrodes correspond to each other, forming a Z axial polarized direction. The second PVDF layer has a plurality of third electrodes located in an upper surface, and the third electrodes have a finger fork shape, forming an X axial polarized direction. The third PVDF layer has a plurality of fourth electrodes located in an upper surface, and the fourth electrodes have a finger fork shape, forming a Y axial polarized direction. The first line layer has a plurality of first electrical connection portions located in a bottom surface and a plurality of first signal lines located in an upper surface of the first line layer. Each of the first electrical connection portions and each of the first electrodes correspond to each other. The second line layer has a plurality of second electrical connection portions located in an upper surface of the second line layer and has a plurality of second signal lines located in a bottom surface of the second line layer. Each of the second electrical connection portions and each of the second electrodes correspond to each other. The third line layer has a plurality of third electrical connection portions located in a bottom surface of the third line layer and has a plurality of third signal lines located in an upper surface of the third line layer. The fifth layer has a plurality of fifth electrical connection portions located in a bottom surface and a plurality of fifth signal lines located in an upper surface of the fifth line layer. The first PVDF layer is sandwiched between the first line layer and the second line layer. The third line layer is located above the second PVDF layer, and the fifth layer is located above the third PVDF layer. When the first PVDF layer, the second PVDF layer, and the third PVDF layer are deformed by an external force, the first signal lines, the second signal lines, the third signal lines, and the fifth signal lines respectively transmit electrical signals according to the deformation of the first PVDF layer, the second PVDF layer, and the third PVDF layer. In this embodiment, each of the third electrical connection portions and each of the fifth electrical connection portions have a bar shape and correspond to each other.

In yet another embodiment, a triaxial piezoelectric sensor includes a first PVDF layer, a second PVDF layer, a third PVDF layer, a first line layer, a second line layer, a third line layer, a fourth line layer, a fifth line layer, and a sixth line layer. The first PVDF layer has a plurality of first electrodes located in an upper surface and has a plurality of second electrodes located in a bottom surface. Each of the first electrodes and each of the second electrodes correspond to each other, forming a Z axial polarized direction. The second PVDF layer has a plurality of third electrodes in its upper surface. The third electrodes have a finger fork shape, forming an X axial polarized direction. The third PVDF layer has a plurality of fourth electrodes on its upper surface, and the fourth electrodes have a finger fork shape, forming a Y axial polarized direction. The first line layer has a plurality of first electrical connection portions located in a bottom surface of the first line layer and has a plurality of first signal lines located in an upper surface of the first line layer. Each of the first electrical connection portions and each of the first electrodes correspond to each other. The second line layer has a plurality of second electrical connection portions located in an upper surface of the second line layer and has a plurality of second signal lines located in a bottom surface of the second line layer. Each of the second electrical connection portions and each of the second electrodes correspond to each other. The third line layer has a plurality of third electrical connection portions located in a bottom surface of the third line layer and has a plurality of third signal lines located in an upper surface of the third line layer. The fourth line layer has a plurality of fourth electrical connection portions located in an upper surface and a plurality of fourth signal lines located in a bottom surface of the fourth line layer. In this embodiment, each of the third electrical connection portions and each of the fourth electrical connection portions have a square shape or a circular shape and correspond to each other. The fifth line layer has a plurality of fifth electrical connection portions located in a bottom surface of the fifth line layer and has a plurality of fifth signal lines located in an upper surface of the fifth line layer. The sixth line layer has a plurality of sixth electrical connection portions located in an upper surface of the sixth line layer and has a plurality of sixth signal lines located in a bottom surface of the sixth line layer. In this embodiment, each of the fifth electrical connection portions and each of the sixth electrical portions have a square shape or a circular shape and correspond to each other. The first PVDF layer is sandwiched between the first line layer and the second line layer. The second PVDF layer is sandwiched between the third line layer and the fourth line layer. The third PVDF layer is sandwiched between the fifth line layer and the sixth line layer. When the first PVDF layer, the second PVDF layer, and the third PVDF layer are deformed because of an external force, the first signal lines, the second signal lines, the third signal lines, the fourth signal lines, the fifth signal lines, and the sixth signal lines respectively transmit electrical signals according to the deformation of the first PVDF layer, the second PVDF layer and the third PVDF layer.

DETAILED DESCRIPTION

To more clearly explain the technology of the present inventions, several embodiments are explained as follows.

Figure 1:
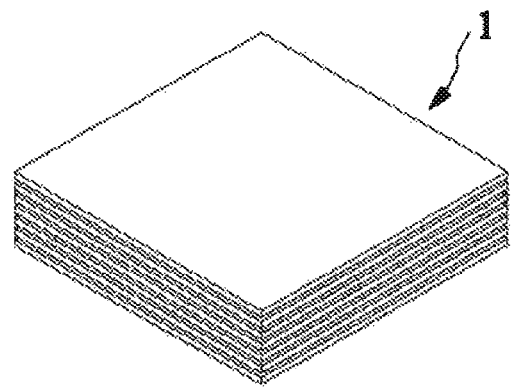
FIG. 1 illustrates a first embodiment of a triaxial piezoelectric sensor according to the present invention.
Figure 2:
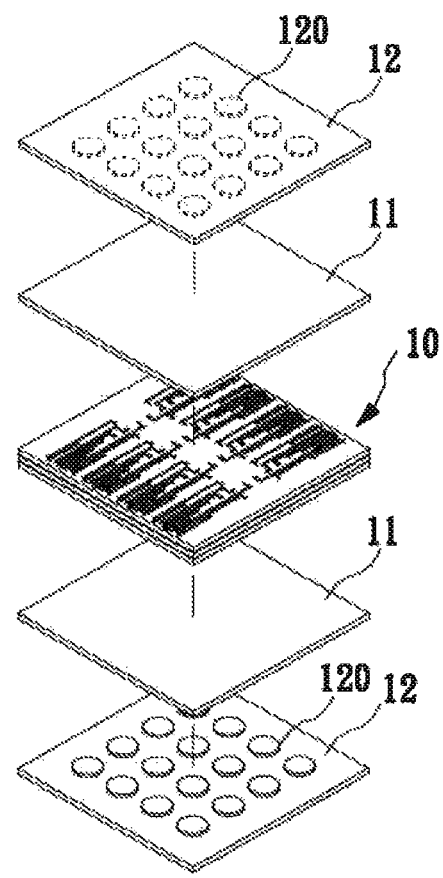
FIG. 2 illustrates an exploded diagram of FIG. 1.
Figure 3:
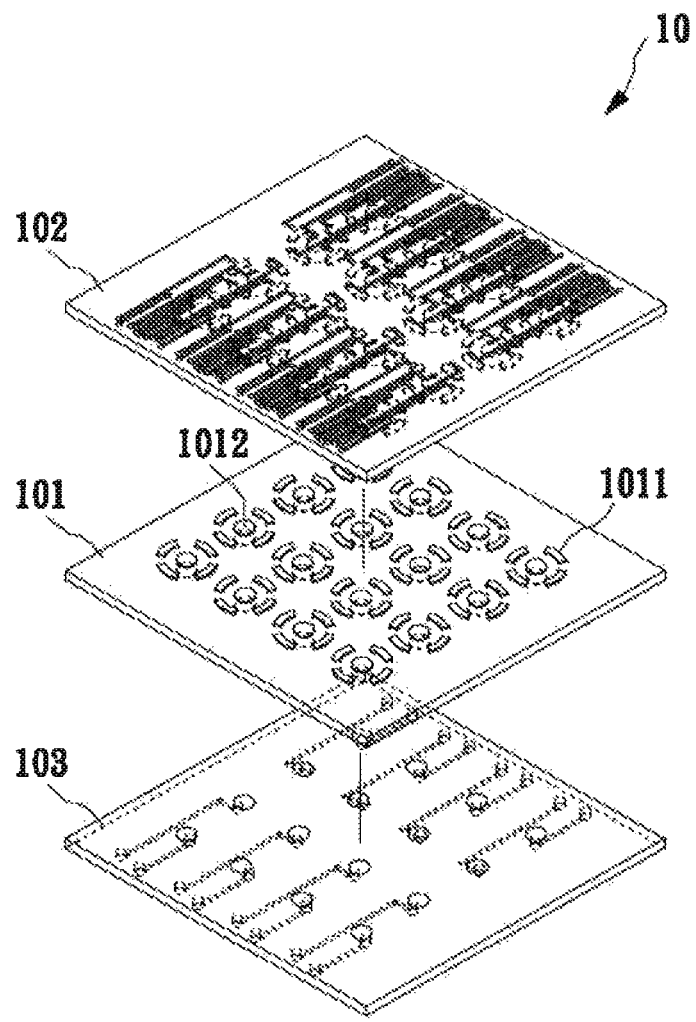
FIG. 3 illustrates an exploded diagram of structure of the sensor body of FIG. 2.

Please refer to FIG. 1 to FIG. 3. FIG. 1 is a first embodiment of a triaxial piezoelectric sensor 1. A major sensing function of the triaxial piezoelectric sensor 1 is achieved when the sensor body 10 in the triaxial piezoelectric sensor 1 is deformed to generate an electrical signal. Please refer to FIG. 3; the sensor body 10 comprises a Polyvinylidene (PVDF) layer 101, a first line layer 102, and a second line layer 103, wherein the PVDF layer 101 is located between the first line layer 102, and the second line layer 103.

Figure 4A:
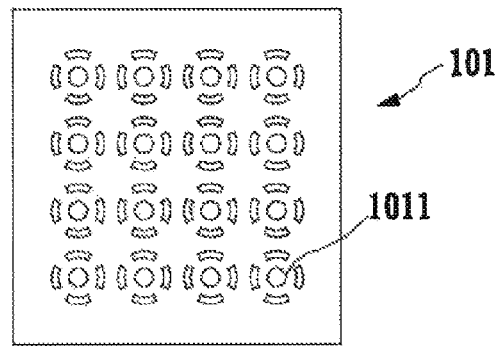
FIG. 4A-4C respectively illustrate an upper surface, a lateral surface, and a bottom surface of the PVDF layer in FIG. 2.
Figure 4B:
Figure 4C:
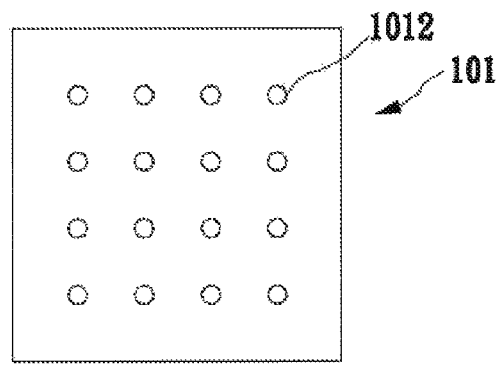
Figure 4D:
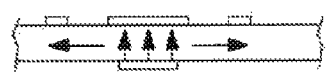
FIG. 4D illustrates polarized directions of the dashed line portion in FIG. 4B.

Please refer to FIG. 4A to FIG. 4D, which explain details of the PVDF layer 101. FIG. 4A illustrates a top view of the PVDF layer 101, FIG. 4B illustrates a lateral view of the PVDF layer 101, FIG. 4C illustrates a bottom view of the PVDF layer 101, and FIG. 4D illustrates the polarized directions on the dashed portion indicated in FIG. 4B. As indicated in FIG. 4A, first electrodes 1011 are located in an upper surface of the PVDF layer 101. FIG. 4C illustrates that second electrodes 1012 are located in a bottom surface of the PVDF layer 101. The positions of each of the first electrodes 1011 and each of the second electrodes 1012 correspond to each other for forming an X-Y-Z triaxial polarized directions as indicated in FIG. 4D. In a first embodiment, the first electrodes 1011 and the second electrodes 1012 are deposited in the PVDV layer 101 using physical vapor deposition (PVD) method. Each of the first electrodes 1011 comprises a circular portion and a plurality of arc segments. The arc segments surround the circular portion, forming an X-Y axial polarized direction. Each of the second electrodes comprises a corresponding circular portion respectively corresponding to each of the circular portions, forming a. Z axial polarized direction. Please note that the first embodiment may be varied by changing the first electrodes to have a square shape or other shapes (not shown) with multiple line segments. For example, each line segment is separately located outside the edge of the square shape (similar to the positions indicated in FIG. 4A), forming an X-Y axial polarized direction. Each of the second electrodes, when they have a square shape or other similar shapes, respectively corresponds to the square shape or similar shapes of the first electrodes, forming a Z axial polarized direction. In the first embodiment, polarization of the PVDF layer 101 is first completed in the X-Y direction and then in the Z direction. Because the technology of applying voltage to polarize PVDF is well known, it is not described further here. In the first embodiment, the PVDF layer 101 is designed to have both the piezoelectric constants d33 and d31.

Figure 5A:
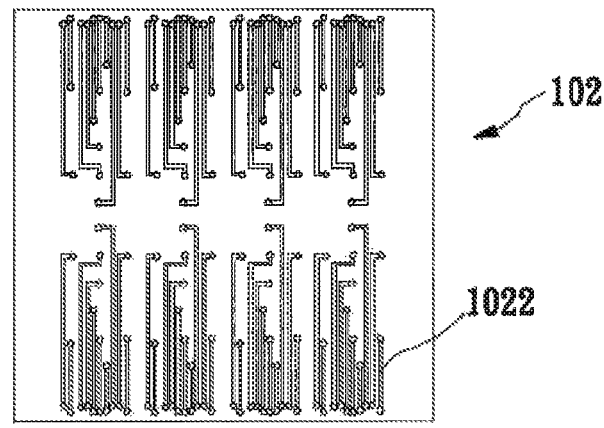
FIG. 5A-5C respectively illustrate an upper surface, a lateral surface, and a bottom surface of the first line layer in FIG. 2.
Figure 5B:
Figure 5C:
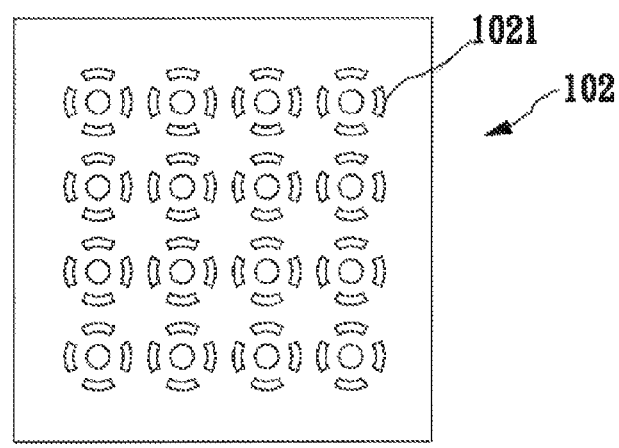

FIG. 5A to 5C respectively illustrate an upper surface, a lateral surface, and a bottom surface. In the first embodiment, the first line layer 102 has a plurality of first electrical connection portions 1021 located in a bottom surface and a plurality of first signal lines 1022 located in an upper surface of the first line layer 102. Each of the first electrical connection portions 1021 and each of the first electrodes 1011 correspond to each other. In this embodiment, the first electrical connection portions 1021 also comprise circular portions and a plurality of arc segments, wherein the arc segments surround the circular portion. In varied embodiments, the circular portions and the arc segments may be changed to square shapes and line segments or other similar shapes (not shown).

Figure 6A:
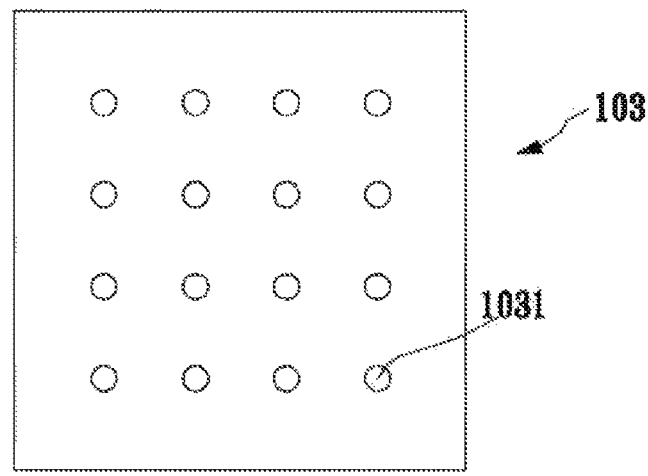
FIG. 6A-6C respectively illustrate an upper surface, a lateral surface, and a bottom surface of the second line layer in FIG. 2.
Figure 6B:
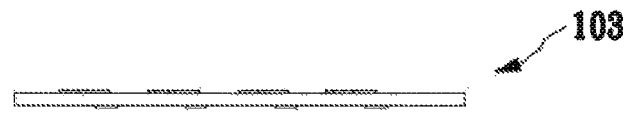
Figure 6C:
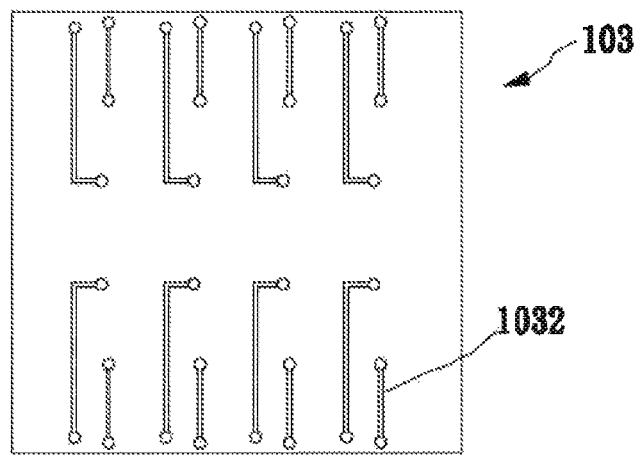

FIG. 6A to FIG. 6C respectively illustrate an upper surface, a lateral surface, and a bottom surface of the second line layer 103. The second line layer 103 has a plurality of second electrical connection portions 1031 located in an upper surface of the second line layer 103 and has a plurality of second signal lines 1032 located in a bottom surface of the second line layer 103. Each of the second electrical connection portions 1031 and each of the second electrodes 1012 correspond to each other. In this embodiment, the second electrical connection portions 1031 are also of circular shape. In varied embodiments, however, the circular shape may be changed to a square shape or other similar shapes (not shown).

Please refer back to FIG. 3; the PVDF layer 101 is sandwiched between the first line layer 102 and the second line layer 103. When the sensor body 10 is deformed due to an external force, which means the PVDF layer 101 is deformed because of the external force, the first signal lines 1022 and the second signal lines 1032 are able to transmit electrical signals according to the deformation of the PVDF layer 101. Because the piezoelectric effect is already known to persons in the art, related details are not repeated here again for brevity.

Please refer back to FIG. 2; in a preferred case in the first embodiment, the triaxial piezoelectric sensor 1 further comprises two insulation layers 11 respectively located above the first line layer 102 and below the second line layer 103. Further, two rubber layers 12 are disposed respectively above and below the two insulation layers 11. Each rubber layer 12 comprises a plurality of protrusion portions 120. When the triaxial piezoelectric sensor 1 is applied with an external force, the protrusion portions 120 are able to amplify the external force to make the PVDF layer more sensitive.

Figure 7:
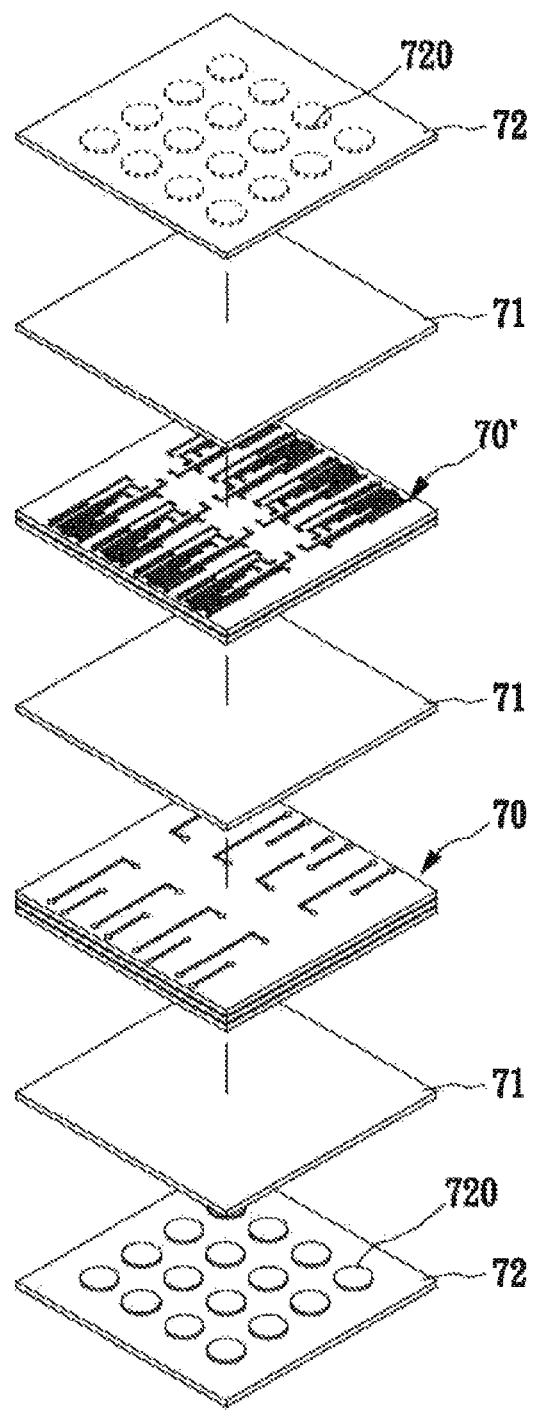
FIG. 7 illustrates a second embodiment of the triaxial piezoelectric sensor according to the present invention.
Figure 8:
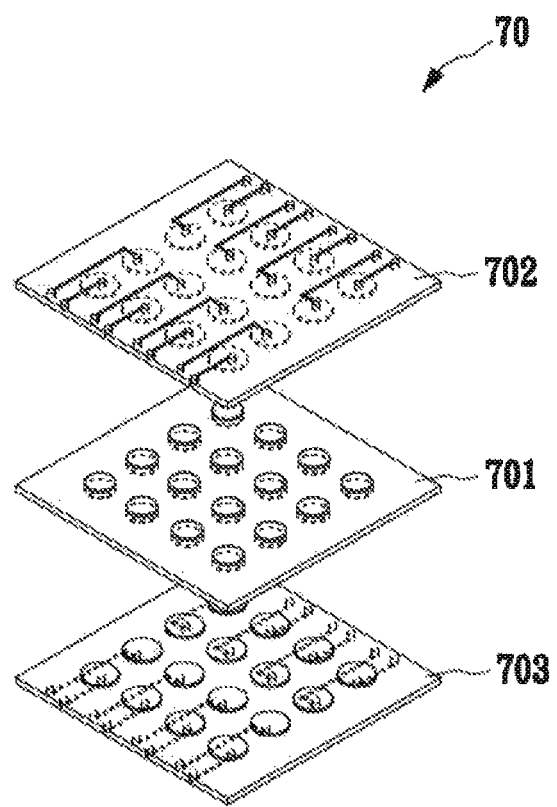
FIG. 8 illustrates an exploded diagram of the first sensor body in FIG. 7.
Figure 9A:
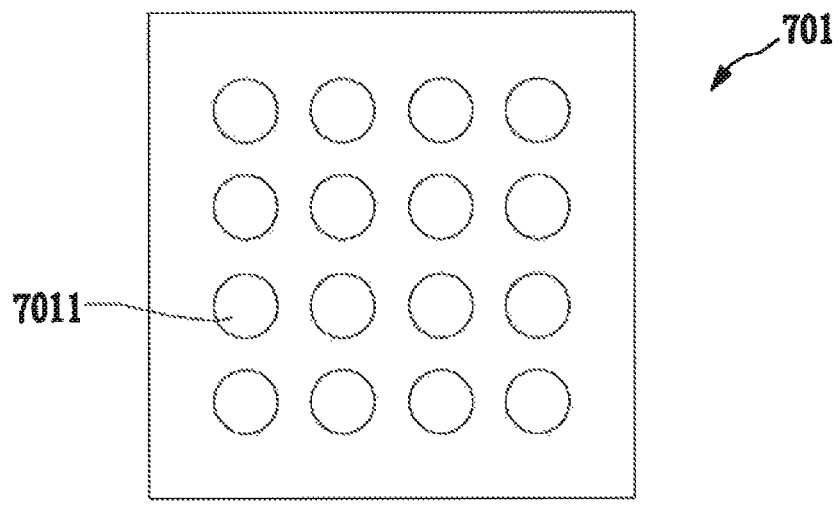
FIG. 9A-9B respectively illustrate an upper surface and a lateral surface of the first PVDF layer in FIG. 8.
Figure 9B:
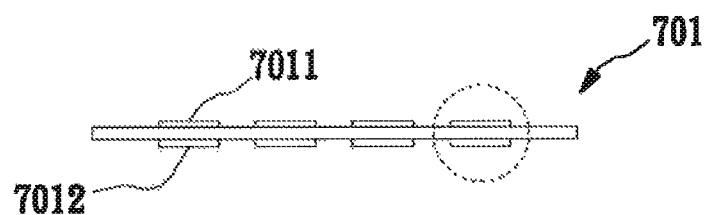
Figure 9C:
FIG. 9C illustrates polarized direction of the dashed line portion in FIG. 9B.

FIG. 7 illustrates a second embodiment of a triaxial piezoelectric sensor and its varied embodiment. As illustrated in FIG. 7, the triaxial piezoelectric sensor 7 comprises a first sensor body 70 and a second sensor body 70'. Please refer firstly to FIG. 8, in which the first sensor body 70 comprises a first PVDF layer 701, a first line layer 702, and a second line layer 703. The first PVDF layer 701 is sandwiched between the first line layer 702 and the second line layer 703. FIG. 9A and FIG. 913 respectively illustrate an upper surface and a lateral surface of the first PVDF layer 701. The first PVDF layer 701 has a plurality of first electrodes 7011 located in its upper surface and a plurality of second electrodes 7012 in its bottom surface. FIG. 9C illustrates the direction of polarization of the dashed line portion in FIG. 9B. Each of the first electrodes 7011 and each of the second electrodes 7012 correspond to each other, forming a Z axial polarized direction. In the second embodiment, the first PVDF layer 701 is designed with a piezoelectric constant of d33.

Figure 10A:
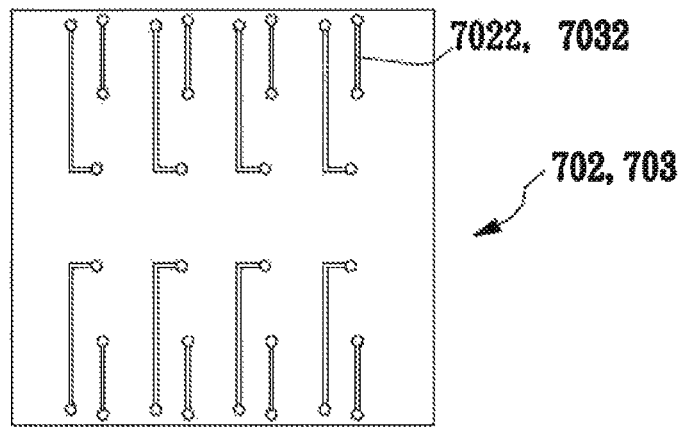
FIG. 10A-10C respectively illustrate an upper surface, a lateral surface, and a bottom surface of the first line layer in FIG. 8.
Figure 10B:
Figure 10C:
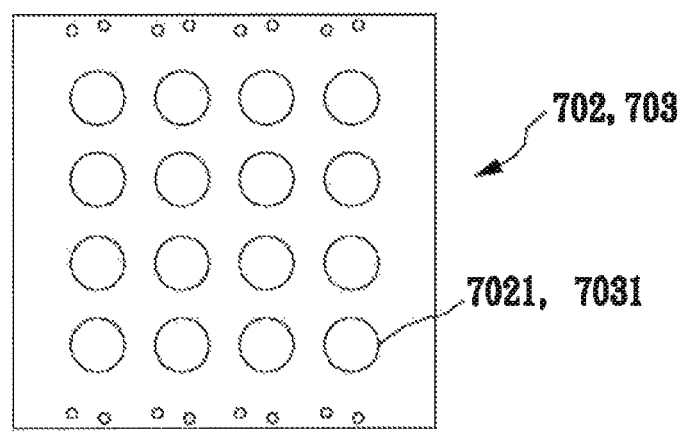

In the second embodiment, the first line layer 702 and the second line layer 703 are substantially the same but only different in the opposed upper surface and bottom surface. Such an arrangement helps simplify the manufacturing process. FIG. 10A-10C respectively illustrate an upper surface, a lateral surface, and a bottom surface of the first line layer. The first line layer 702 has a plurality of first electrodes 7021 located in a bottom surface of the first line layer 702 and has a plurality of first signal lines 7022 located in an upper surface of the first line layer 702.

Because the line layer 702 and the second line layer 703 are substantially the same but only different in the opposed upper surface and bottom surface, it is proper to use FIG. 10A-10C for also illustrating the second line layer 703. For brevity, FIG. 10A-10C are also used for illustrating a bottom surface, a lateral surface, and an upper surface of the second line layer 703. The second line layer 703 has a plurality of second electrical connection portions 7031 located in an upper surface of the second line layer 703 and has a plurality of second signal lines 7032 located in a bottom surface of the second line layer 703.

In the second embodiment, each of the first electrical connection portions 7021 and each of the first electrodes 7011 correspond to each other. Each of the second electrical connection portions 7031 and each of the second electrodes 7012 correspond to each other. In this embodiment, the first electrodes 7011 and the second electrodes 7012 are deposited by using PVD method to have a circular shape for forming a Z axial polarized direction. In varied embodiments, however, the first electrodes and the second electrodes may be a square shape, a polygonal shape, or other similar shapes (now shown).

Figure 11:
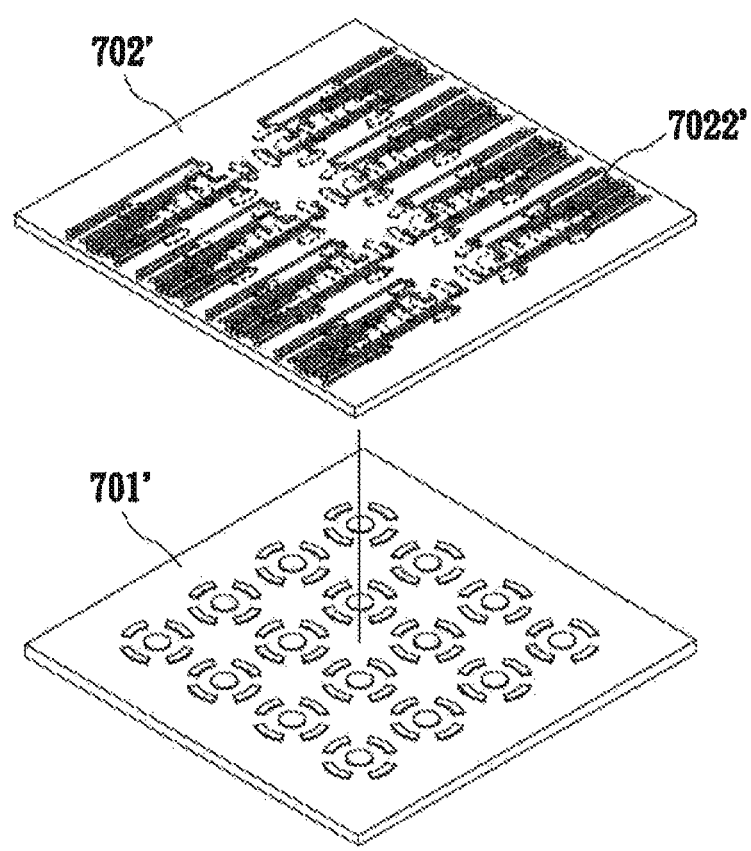
FIG. 11 illustrates an exploded diagram of the second sensor body in FIG. 7.
Figure 12A:
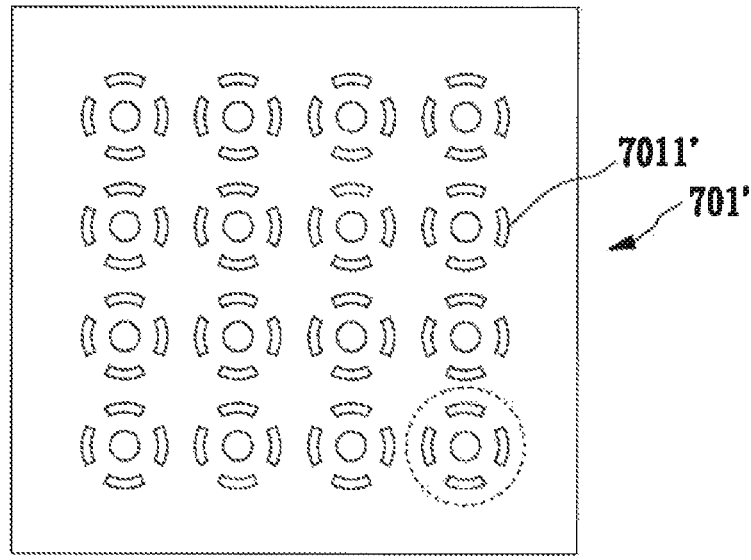
FIG. 12A-12B respectively illustrate an upper surface and a lateral surface of the second PVDF layer in FIG. 11.
Figure 12B:
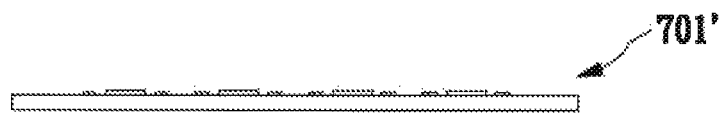
Figure 12C:
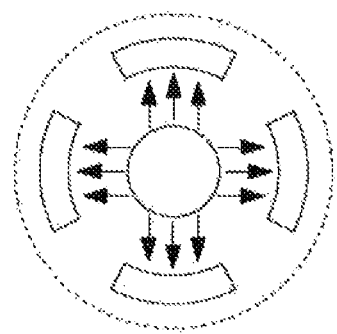
FIG. 12C illustrates polarized directions of the dashed line portion in FIG. 12B.

Please refer to FIG. 11, in which the second sensor body 70' comprises of the second PVDF layer 701' and a third line layer 702'. FIG. 12A-12B respectively illustrate an upper surface and a lateral surface of the second PVDF layer in FIG. 11. The second PVDF layer 701' has a plurality of third electrodes 7011' on its upper surface, forming an X-Y axial polarized direction (as shown in FIG. 12C). In this embodiment, the third electrodes 7011' are also deposited using PVD. The third electrodes 7011' comprise a circular portion and a plurality of arc segments, wherein the plurality of arc segments surround the circular portion, forming an X-Y axial polarized direction. Alternatively, in varied embodiments now shown in the drawings, the third electrodes may comprise a square shape (or polygonal shape) and four line segments (or multiple line segments). The four line segments are located outside the square shape, forming an X-Y axial polarized direction. In the second embodiment, the second PVDF layer 701' is designed to have a piezoelectric constant of d31.

Because the third electrodes 7011' have the same shapes as those of the first electrodes 1011 in the first embodiment, the third line layer 702' is substantially the same as the first line layer 102 of the first embodiment, and therefore it is not repeated here again. Similarly, the third line layer has a plurality of electrical connection portions located in a bottom surface of the third line layer and has a plurality of third signal lines located in an upper surface of the second line layer. Each of the third electrical connection portions and each of the third electrodes correspond to each other.

Please refer back to FIG. 7; in a preferred embodiment, an insulation layer 71 is disposed between the first sensor body 70 and the second sensor body 70'; another insulation layer 71 is below the first sensor body 70, and another insulation layer 71 is located above the second sensor body 70'. Two rubber layers 72 are located in the outermost side, sandwiching all components therein. Similarly, each rubber layer 72 comprises a plurality of protrusion portions 120. When an external force is applied to the triaxial piezoelectric sensor 7, the protrusion portion 720 is able to amplify the external force so as to increase the sensitivity of the PVDF layers 701 and 701'. When an external force is applied to the first sensor body 70 and the second sensor body 70', which means the first PVDF layer 701 and the second PVDF layer 701' are deformed due to the external force, the first signal lines 7022, the second signal lines 7023, and the third signal lines 7022' respectively transmit electrical signals according to the deformation of the first PVDF layer 701 and the second PVDF layer 701'.

Figure 13:
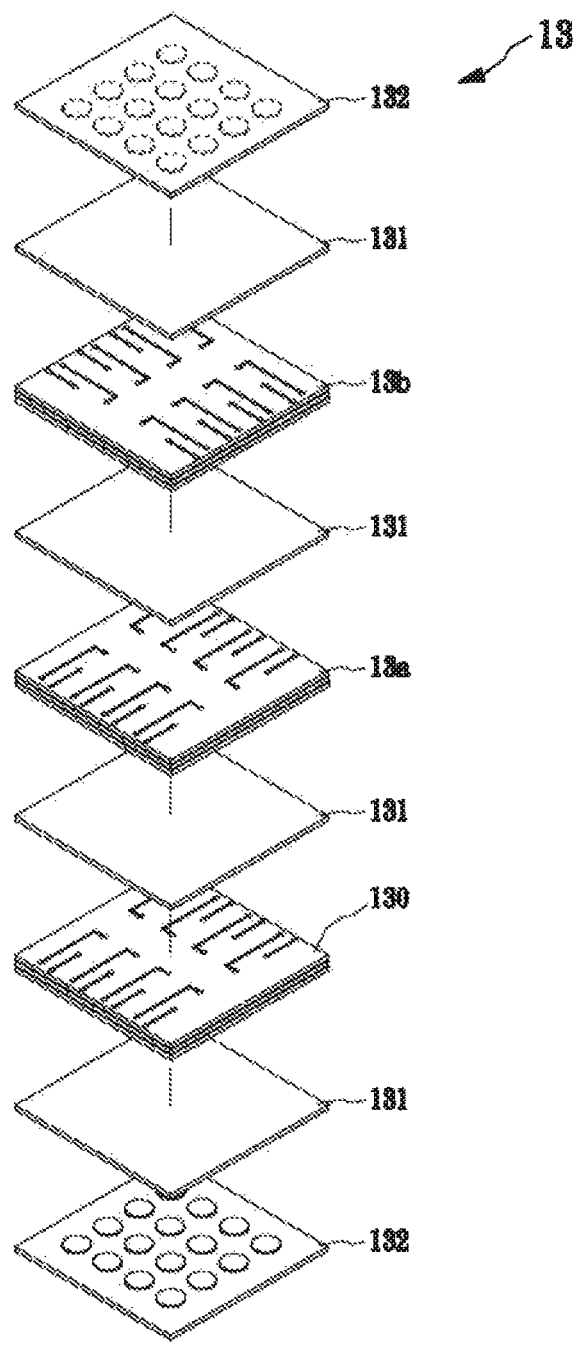
FIG. 13 illustrates a third embodiment of a triaxial piezoelectric sensor according to the present invention.

FIG. 13 illustrates a third embodiment of a triaxial piezoelectric sensor. As illustrated in FIG. 13, the triaxial piezoelectric sensor 13 comprises a first sensor body 13, a second sensor body 13a, and a third sensor body 13b. The first sensor body 130 of this embodiment is substantially the same as the first sensor body of the second embodiment, and therefore, further details are not repeated again. Similar to the first sensor body 70 of the second embodiment, the first PVDF layer of the first sensor body 130 has a plurality of first electrodes on an upper surface and a plurality of second electrodes in a bottom surface. Each of the first electrodes and each of the second electrodes correspond to each other for forming a Z axial polarized direction. In the third embodiment, the first PVDF layer is designed for having a piezoelectric constant of d33.

Because the second sensor body 13a and the third sensor body 13b are substantially the same, the second sensor body 13b is only explained with the structure of the second sensor body 13a in the following disclosure.

Figure 14:
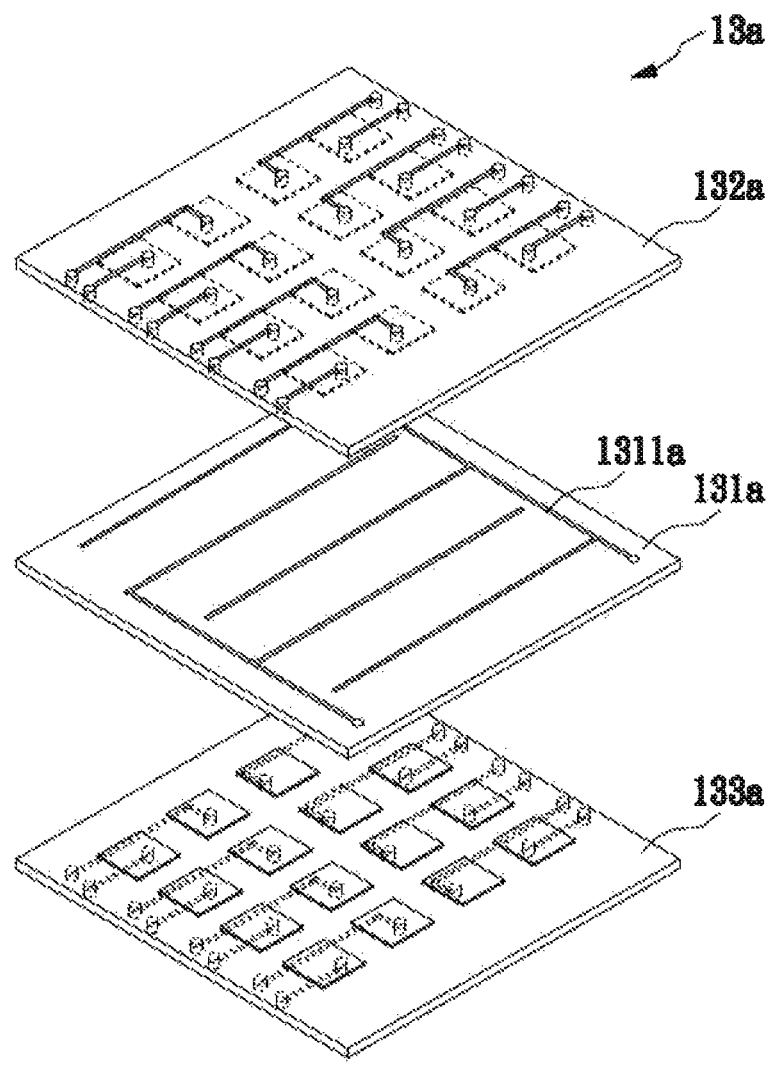
FIG. 14 illustrates an exploded diagram of the second sensor body in FIG. 13.
Figure 15A:
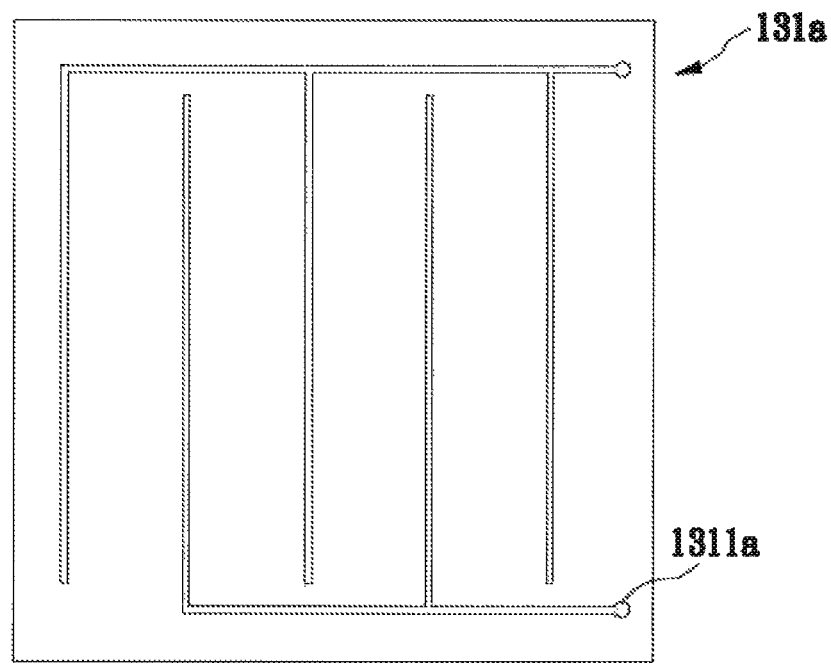
FIGS. 15A and 15B respectively illustrate an upper surface and a lateral surface of the second PVDF layer of the third embodiment.
Figure 15B:
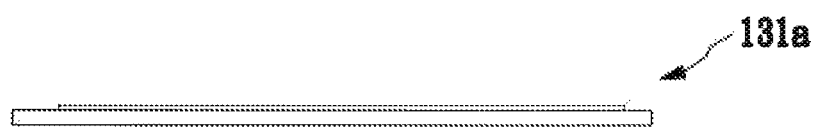

Please refer to FIG. 14; the second sensor body 13a of the third embodiment comprises a second PVDF layer 131a, a third line layer 132a and a fourth line layer 133a. The second PVDF layer 131a is sandwiched between the third line layer 132a and the fourth line layer 133a. FIG. 15A and FIG. 15B respectively illustrate an upper surface and a lateral surface of the second PVDF layer 131a. The second PVDF layer 131a has a plurality of third electrodes 1311a located in its upper surface. The third electrodes 1311a have a shape of a finger fork, forming an X axial polarized direction. As illustrated in FIG. 13, the third PVDF layer (reference to the third sensor body 13b) is rotated 90 degrees with respect to the second PVDF layer (reference to the second sensor body 13a) forming a Y axial polarized direction. In the third embodiment, the second PVDF layer and the third PVDF layer are designed for having a piezoelectric constant of d31.

Figure 16A:
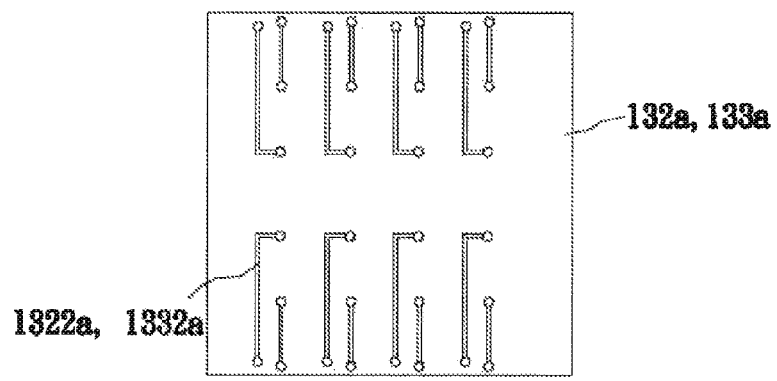
FIG. 16A-16C respectively illustrate an upper surface of the third line layer of the third embodiment.
Figure 16B:
Figure 16C:
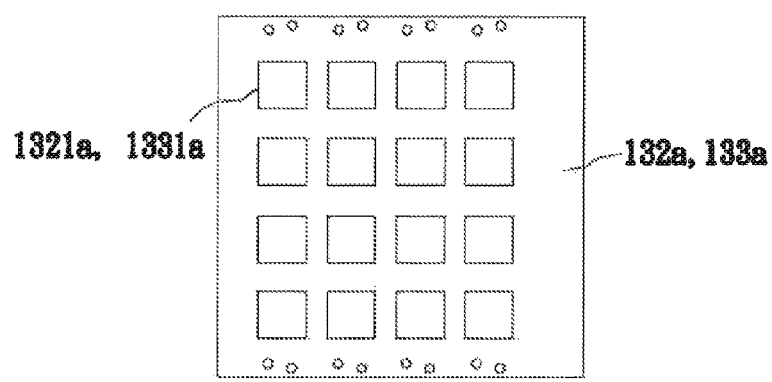

In the third embodiment, the third line layer 132 for the second sensor body 13a is substantially the same as the fourth line layer 133a, only having opposite upper and bottom surfaces. FIG. 16A-16C respectively illustrate an upper surface, a lateral surface, and a bottom surface of the third line layer. The third line layer 132a has a plurality of third electrical connection portions 1321a located in a bottom surface of the third line layer 1321a and has a plurality of third signal lines 1322a located in an upper surface of the third line layer 1321a.

Because the third line layer 132a of the third embodiment is substantially the same as the fourth line layer 133a, only having opposite upper and bottom surfaces, FIG. 16A-16C are also used for illustrating the fourth line layer 133a. For brevity, FIG. 16A-16C are used for illustrating a bottom surface, a lateral surface, and an upper surface of the fourth line layer 133a. The fourth line layer 133a has a plurality of fourth electrical connection portions 1331a located in an upper surface of the fourth line layer and has a plurality of fourth signal lines 1332 located in a bottom surface of the fourth line layer 133a. In this embodiment, the fourth electrical connection portions 1331a are designed having a square shape, but they can also be changed to a circular shape or other similar shapes.

Please refer back to FIG. 13. Similar to the first embodiment and the second embodiment, the triaxial piezoelectric sensor 13 in the third embodiment may comprise several insulation layers 131 respectively located between different components and may comprise two rubber layers 132 located as the topmost and bottom layers for amplifying the external force and increasing sensitivity.

Figure 17:
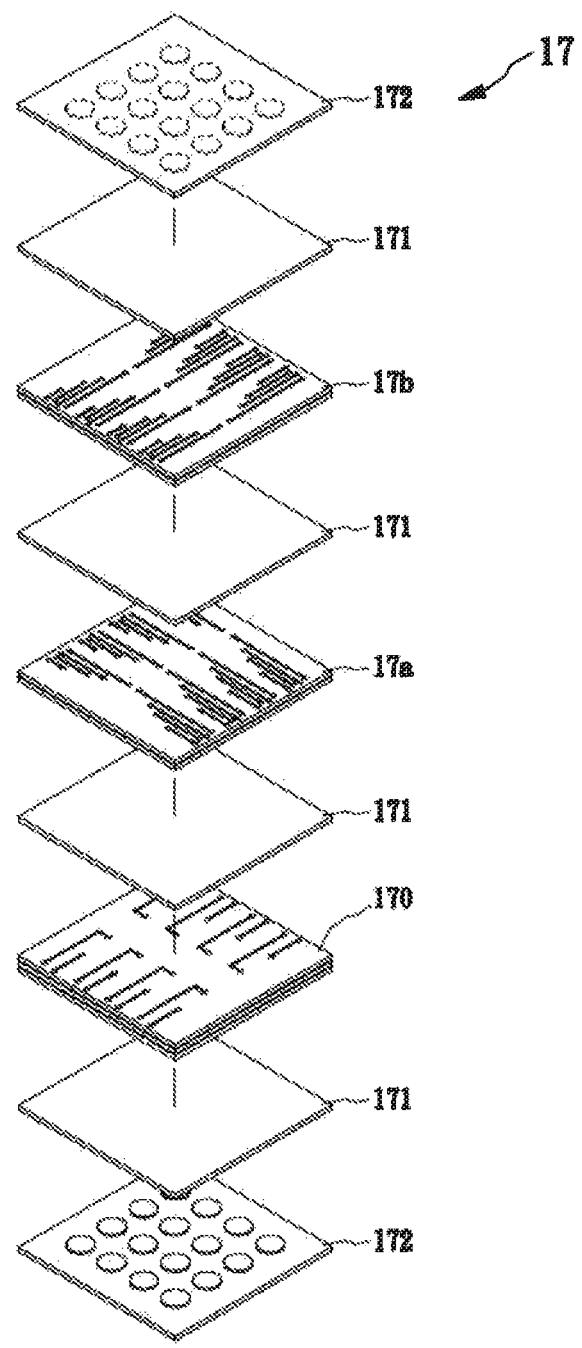
FIG. 17 illustrates a fourth embodiment of a triaxial piezoelectric sensor according to the present invention.

FIG. 17 is a fourth embodiment of a triaxial piezoelectric sensor and its varied embodiment according to the present invention. As illustrated in FIG. 17, the triaxial piezoelectric sensor 17 comprises a first sensor body 170, a second sensor body 17a, and a third sensor body 17b. In this embodiment, again, the first sensor body 170 is substantially the same as the first sensor body 70 of the second embodiment, and therefore its structure is not repeated for brevity. Similar to the first sensor body 70 of the second embodiment, the first PVDF layer of the first sensor body 170 has a plurality of electrodes located in an upper surface and has a plurality of second electrodes located in a bottom surface. Each of the first electrodes and each of the second electrodes correspond to each other, forming a Z axial polarized direction. In the fourth embodiment, the first PVDF layer is designed having a piezoelectric constant of d33.

In the fourth embodiment, the second sensor body 17a is substantially the same as the third sensor body 17b. Therefore, it is only explained as follows for the structure of the second sensor body 17a.

Figure 18:
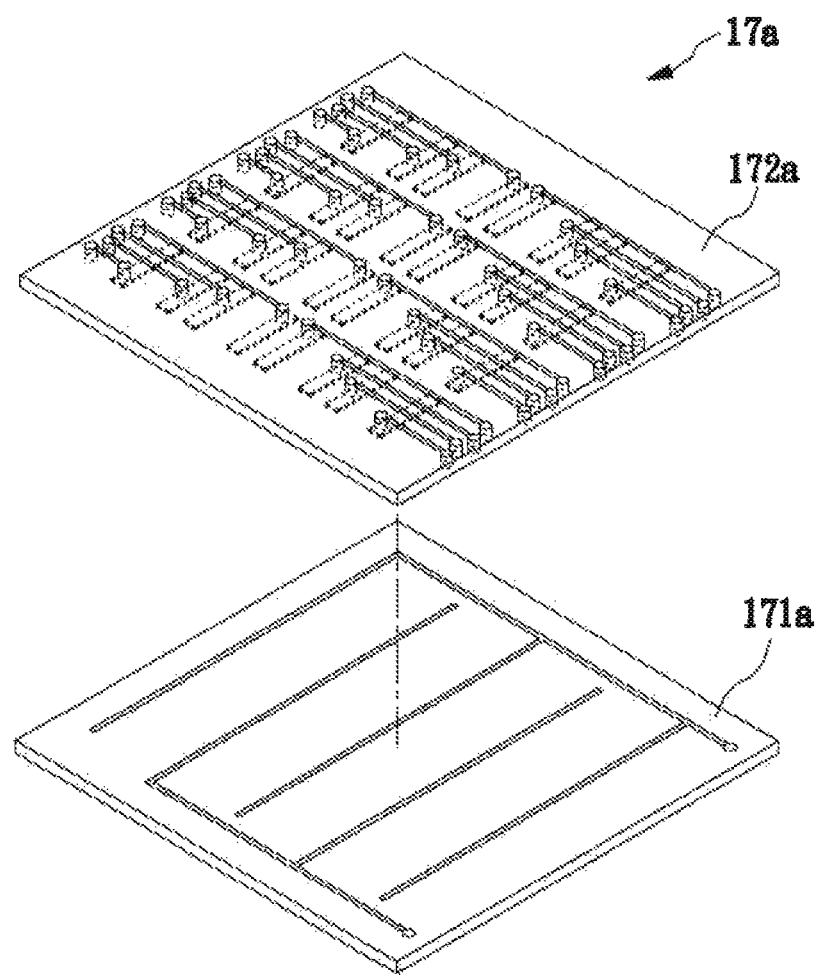
FIG. 18 illustrates an exploded diagram of the second sensor body in FIG. 17.

Please refer to FIG. 18, in which the second sensor body 17a of the third embodiment comprises the second PVDF layer 171a and the third line layer 172a. The third line layer 172a is located above the second PVDF layer 171a. The second PVDF layer 171a is substantially the same as the PVDF layer 131a of FIG. 14. The third electrodes 1711a of the second PVDF layer 171a have a comb shape, forming an X axial polarized direction.

As illustrated in FIG. 17, the third PVDF layer (reference to the third sensor body 17b) is rotated 90 degrees with respect to the second PVDF layer (reference to the second sensor body 17a), forming a Y axial polarized direction. In the fourth embodiment, the second PVDF layer is designed having piezoelectric constant of d33.

Figure 19A:
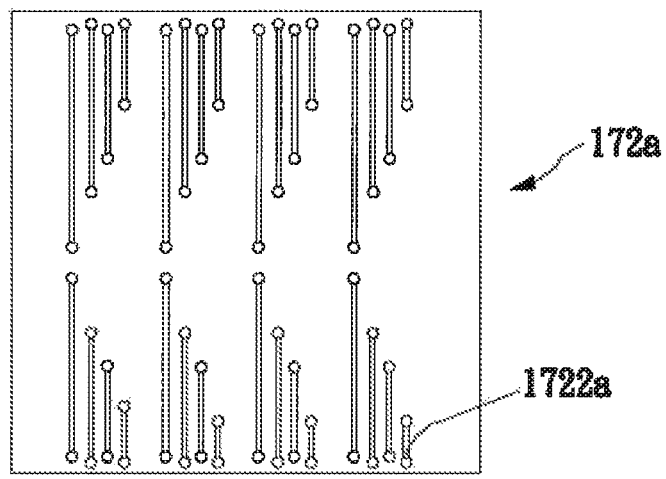
FIG. 19A-19C respectively illustrate an upper surface, a lateral surface, and a bottom surface of the third line layer of the fourth embodiment.
Figure 19B:
Figure 19C:
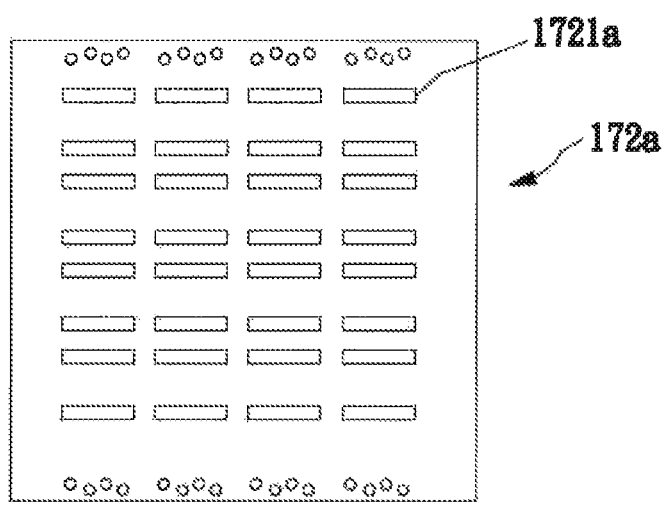

FIG. 19A-19C respectively illustrate an upper surface, a lateral surface, and a bottom surface of the third line layer of the fourth embodiment. The third line layer 172a has a plurality of electrical connection portions 1721a located in a bottom surface of the third line layer 1321a and has a plurality of third signal lines 1722a located in an upper surface of the third line layer 172a. In this embodiment, the third electrical connection portions 1721a are designed having a bar shape, but they may also be changed to an oval shape or other similar shapes.

Please refer back to FIG. 17; similar to the first embodiment and the second embodiment, the triaxial piezoelectric sensor 17 in the third embodiment may also comprise several insulation layers 171 respectively located between different components and may also comprise two rubber layers 172 located on the topmost and bottom-most layer for amplifying external force and increasing sensitivity.

The line layer of the present invention may be coated with metal patterns using polymer as electrical connection portions and signal lines. Such technology is well known to persons skilled in the art and is not described here. Each PVDF layer of the present invention may be about 10 μm, therefore dramatically decreasing the height of the triaxial piezoelectric sensor to achieve the objective of size minimization. In addition, the insulation of the present invention not only insulates components but also protects the signal lines. The rubber layers of the present invention further increase sensitivity.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A triaxial piezoelectric sensor, comprising:
   a polyvinylidene (PVDF) layer having a plurality of first electrodes in an upper surface of the PVDF layer and a plurality of second electrodes in an bottom surface of the PVDF layer, each of the first electrodes and each of the second electrodes corresponding to each other and forming X-Y-Z triaxial polarized directions;
   a first line layer having a plurality of first electrical connection portions in a bottom surface of the first line layer and having a plurality of first signal lines in an upper surface of the first line layer, each of the first electrical connection portions and each of the first electrodes corresponding to each other; and
   a second line layer having a plurality of second electrical connection portions in an upper surface of the second line layer and having a plurality of second signal lines in a bottom surface of the second line layer, each of the second electrical connection portions and each of the second electrodes corresponding to each other;
   the PVDF layer being sandwiched between the first line layer and the second line layer, wherein when the PVDF layer deforms due to an external force; the plurality of first signal lines and the plurality of signal lines transmit an electrical signal according to the deformation of the PVDF layer.

2. The triaxial piezoelectric sensor as claimed in claim 1, wherein the plurality of the first electrodes and the plurality of the second electrodes are deposited in the PVDF layer by using physical vapor deposition (PVD) method, and each of the first electrodes comprising a circular portion and a plurality of arc segments, the plurality of arc portions surrounding the circular portion, forming an X-Y axial polarized direction; and each of the second electrodes having a corresponding circular portion respectively corresponds to the circular portion, forming a Z axial polarized direction.

3. The triaxial piezoelectric sensor as claimed in claim 1, where the plurality of the first electrodes are deposited in the PVDF layer using PVD, each of the first electrodes comprising a polygonal portion and a plurality of line segments, each line segment respectively being located outside each edge of the polygonal portion forming an X-Y axial direction, and each of the second electrodes comprising a corresponding polygonal segment respectively corresponding to each of the polygonal portions.

4. The triaxial piezoelectric sensor as claimed in claim 1, further comprising two rubber layers being separately located above the first line layer and below the second line layer, and each rubber layer comprising a plurality of protruding portions, wherein when an external force is applied to the PVDF layer, the protruding portions amplify the external force.

5. A triaxial piezoelectric sensor, comprising:
   a first PVDF layer having a plurality of first electrodes in an upper surface of the first PVDF layer and a plurality of second electrodes in a bottom surface of the first PVDF layer, each of the first electrodes and each of the second electrodes corresponding to each other and forming a Z axial polarized direction;
   a first line layer having a plurality of first electrical connection portions located in a lower surface of the first line layer and a plurality of signal lines located in an upper surface of the first line layer, each of the first electrical connection portions and each of the first electrodes corresponding to each other;

a second line layer having a plurality of second electrical portions located in an upper surface of the second line layer and a plurality of second signal lines located in a bottom surface of the second line layer, each of the second electrical connection portions and each of the second electrodes corresponding to each other;

a second PVDF layer having a plurality of third electrodes located in an upper surface forming an X-Y axial polarized direction; and a third line layer having a plurality of third electrical connection portions located in a bottom surface of the third line layer and a plurality of third signal lines located in an upper surface of the second line layer, and each of the third electrical connection portions and each of the third electrodes corresponding to each other;

wherein the first PVDF layer is sandwiched between the first line layer and the second line layer, the third line layer is located above the second PVDF layer, and when the first PVDF layer and the second PVDF layer deform due to an external force, the plurality of first signal lines, the plurality of second signal lines, and the plurality of third signal lines separately transmit electrical signals according to the deformation of the first PVDF layer and the second PVDF layer.

6. The triaxial piezoelectric sensor as claimed in claim 5, wherein the plurality of first electrodes, the plurality of second electrodes and the plurality of third electrodes are deposited in the first PVDF layer and the second PVDF layer by using PVD method, each of the first electrodes having a first circular portion, each of the second electrodes having a corresponding circular portion separately corresponding to each of the first circular portions, forming a Z axial polarized direction, and each of the third electrodes having a second circular portion and a plurality of arc segments, the plurality of arc segments surrounding the second circular portions, forming an X-Y axial polarized direction.

7. The triaxial piezoelectric sensor as claimed in claim 5, wherein the plurality of first electrodes, the plurality of second electrodes, and the plurality of third electrodes are deposited in the first PVDF layer and the second PVDF layer by using PVD method, each of the first electrodes having a first polygonal portion each of the second electrode having a corresponding polygonal portion separately corresponding to each of the first polygonal portions, forming a Z axial polarized direction, and each of the third electrodes having a second polygonal portion and a plurality of line segments, each of the line segments being separately located outside the edge of each line segment of the second polygonal segment, forming an X-Y axial polarized direction.

8. A triaxial piezoelectric sensor, comprising:
a first PVDF layer having a plurality of electrodes locating in an upper surface of the first PVDF layer and a plurality of second electrodes in a bottom surface of the PVDF layer, each of the first electrodes and each of the second electrodes corresponding to each other, forming a Z axial polarized direction;

a first line layer having a plurality of first electrical connection portions being located in a bottom surface of the first line layer and a plurality of first signal lines being located in an upper surface of the first line layer, each of the first electrical connection portions and each of the first electrodes corresponding to each other;

a second line layer having a plurality of second electrical connection portions being located in an upper surface of the second line layer and a plurality of second signal lines being located in a bottom surface of the second line layer, and each of the second electrical connection portions and each of the second electrodes corresponding to each other;

a second PVDF layer having a plurality of third electrodes being located in an upper surface of the second PVDF layer, the plurality of third electrodes having a finger fork shape, forming an X axial polarized direction;

a third line layer having a plurality of third electrical connection portions being located in a bottom surface of the third line layer and a plurality of third signal lines being located in an upper surface of the third line layers;

a third PVDF layer having a plurality of fourth electrodes in an upper surface of the third PVDF layer, the plurality of the fourth electrodes having a finger fork shape, forming a Y axial polarized direction;

a fifth line layer having a plurality of fifth electrical connection portions being located in a bottom surface of the fifth line layer and a plurality of signal lines being located in an upper surface of the fifth line layer;

wherein each of the first PVDF layers is sandwiched between the first line layer and the second line layer, the third line layer is located above the second PVDF layer, the fifth line layer is located above the third PVDF layer, and when the first PVDF layer, the second PVDF layer, and the third PVDF layer deform due to an external force, the plurality of first signal lines, the plurality of second signal lines, the plurality of third signal lines, and the plurality of fifth signal lines separately transmit electrical signals according to the deformation of the first PVDF layer, the second PVDF layer, and the third PVDF layer.

9. The triaxial piezoelectric sensor as claimed in claim 8, wherein each of the plurality of third electrical connection portions and each of the plurality of fifth electrical connections have a long bar shape and correspond to each other.

10. The triaxial piezoelectric sensor as claimed in claim 8, further comprising:
a fourth line layer having a plurality of fourth electrical connection portions being located in an upper surface of the fourth line layer and having a plurality of fourth signal lines being located in a bottom surface of the fourth line layer, and each of the plurality of third electrical connection portions and each of the plurality of fourth electrical connection portions having a square shape or a circular shape and correspond to each other;

a sixth line layer having a plurality of sixth electrical connection portions being located in an upper surface of the sixth line layer and a plurality of six signal lines being located in a bottom surface of the sixth line layer, and each of the plurality of fifth electrical connection portions and each of the plurality of sixth electrical connection portions having a square shape or a circular shape and corresponding to each other;

wherein, when the second PVDF layer is sandwiched between the third line layer and the fourth line layer and the third PVDF layer is sandwiched between the fifth line layer and the sixth line layer, and when the first PVDF layer, the second PVDF layer, and the third PVDF layer deform due to an external force, the plurality of first signal lines, the plurality of second signal lines, the plurality of third signal lines, the plurality of fourth signal lines, the plurality of fifth signal lines, and the plurality of sixth signal lines separately transmit electrical signals according to the deformation of the first PVDF layer, the second PVDF layer, and the third PVDF layer.

* * * * *